United States Patent [19]
Kilner

[11] Patent Number: 5,177,660
[45] Date of Patent: Jan. 5, 1993

[54] BIODEGRADABLE AND RECYCLABLE ELECTROSTATICALLY SHIELDED PACKAGING FOR ELECTRONIC DEVICES AND MEDIA

[75] Inventor: George E. Kilner, Pleasanton, Calif.

[73] Assignee: Sunclipse, Inc., Montebello, Calif.

[21] Appl. No.: 581,723

[22] Filed: Sep. 11, 1990

[51] Int. Cl.$^5$ .............................................. H02B 1/26
[52] U.S. Cl. ..................................... 361/220; 361/212
[58] Field of Search ............... 361/212, 220; 428/34.3, 428/35.3; 206/328

[56] References Cited

U.S. PATENT DOCUMENTS

| | | | |
|---|---|---|---|
| 4,160,503 | 7/1979 | Ohlbach | 206/328 |
| 4,528,222 | 7/1985 | Rzepecki | 428/35 |
| 4,529,087 | 7/1985 | Neal | 206/328 |
| 4,966,280 | 10/1990 | Bradford | 206/32 |
| 4,974,966 | 12/1990 | Fabbi | 383/1 |
| 5,017,260 | 5/1991 | Bradford | 156/308.2 |

Primary Examiner—A. D. Pellinen
Assistant Examiner—Aditya Krishnan
Attorney, Agent, or Firm—Daniel L. Dawes

[57] ABSTRACT

The invention is a biodegradable and recyclable bag for enclosing electronic circuits or media to shield the same from electrostatic damage. The bag is made of kraft paper and has a grid printed completely over either the entire interior, exterior or both surfaces of the bag. The grid is printed of conductive, highly loaded, carbon ink and penetrates to a degree into the porous surface of the bag. The bag is constructed to have overlapping seams and each portion of the overlap of the seams has the conductive grid printed on it to provide an electrostatically leak-tight seam.

8 Claims, 1 Drawing Sheet

BIODEGRADABLE AND RECYCLABLE ELECTROSTATICALLY SHIELDED PACKAGING FOR ELECTRONIC DEVICES AND MEDIA

BACKGROUND OF THE INVENTION

1. Field of the Invention

The invention relates to the field of packaging and in particular to packaging for electronic circuits and electronic media which packaging provides some type electrostatic shielding.

2. Description of the Prior Art

The electronic industry manufactures and uses as part of their finished products a variety of individual component devices which are highly sensitive to static electricity. Static electricity is generally created by the human body, or human clothing, or insulating materials such as plastics. Static electric charges emanate outward and can effect a sensitive electronic device if the device is penetrated by the charge or comes within the charge's field. The effect to the device can be destruction, or degradation of its ability to function over its lifetime. The failure of sensitive devices result in the loss of millions of worth of products in the electronics industry and the loss of reliability and credibility of products. Protection of static sensitive devices is of prime importance to the electronics industry. Protection of static sensitive components is accomplished by allowing them only to be exposed in static-safe work areas, or enclosing them in static-free and static shielding protective packaging. Protective packaging is a critically important means of containment and transport for sensitive components. The electronic industry purchases many millions of dollars worth of static protective packaging each year.

Electrostatically shielded rooms and enclosures, generally known as Faraday cages, are well known and are utilized in all types of configurations and sizes to protect electronic devices or media such as magnetic tape, cards and the like from damage or alteration by stray electrostatic fields. Such enclosures or containments range from structures in which large devices can be positioned, such as aircraft or trucks down to the size of the electronic device itself. Such Faraday cages generally are comprised of a conductive skin which completely encloses a space. Such skin is often fabricated from a conductive screening such as a woven copper or metallic mesh.

Circuit boards carrying digital integrated chips very often contain firmware which is also susceptible to damage by stray electrostatic fields. Such integrated circuits are packaged for the purposes of shipping in flexible package bags which have a metalized surface. The prior art has used for antistatic packaging of electronic devices or media chemically treated polyethylene bags, polyethylene bags treated with conductive carbon, carbon ink on polyethylene bags, metalized laminated film bags, paper and metal foil laminated bags, paper and heavy carbon coated bags, and carbon saturated paper bags. Such plastic or treated packaging while effective to protect the circuit from electrostatic damage are not biodegradable and recyclable.

After use, the packaging in which the circuit or electronic media is transported is typically thrown away. The prior art plastic metal or treated packaging is virtually indestructible by all ordinary environmental agents and will for practical purposes last forever. At the present time, millions if not billions of such packages are used annually by electronic manufacturers throughout the world. Therefore, there has arisen a serious environmental concern that such electronic packaging will accumulate as a permanent nondegradable waste product in the landfills throughout the world.

Therefore, what is needed is a practical, inexpensive packaging which provides adequate electrostatic shielding for electronic products and media, but which when its propose has been served can be disposed of as a biodegradable product or recycled.

BRIEF SUMMARY OF THE INVENTION

The invention is a biodegradable and recyclable package for electrostatically shielding electronic apparatus from electrostatic fields in an ambient environment. The package comprises a porous biodegradable and recyclable flexible enclosure for completely enclosing the electronic apparatus. The enclosure has a surface between the electronic apparatus and the ambient environment. A network of conductive lines is disposed onto the enclosure on the entirety of the surface.

As a result, the electronic apparatus is effectively shielded from the electrostatic fields by the package and as a result, the package is disposable, biodegradable and recyclable.

In the preferred embodiment the network has a surface resistivity of $10^6$ ohms per square inch or less. The network comprises a plurality of closely spaced conductively lines printed on the surface to form a mesh-like topology. The lines are disposed on the surface by printing of highly carbon-loaded ink. The enclosure is comprised of kraft paper. The enclosure is fabricated in the form of a bag or envelope. The bag has at least one seam. The seam is formed of two overlapping portions of the bag which portions are affixed together. The overlapping portions each have the network disposed thereon. The network is in the form of a grid of linear lines. The grid is comprised of a first grid portion having columns and rows with a first degree of separation between adjacent columns and adjacent rows. A second grid portion has columns and rows with a second degree of separation between adjacent columns and adjacent rows. The second degree of separation has a magnitude less than the first degree of separation. The first grid portion and second grid portion each are disposed over the entire surface. The network penetrates into at least a portion of the porous enclosure beneath the surface. The network is flexible at least as much as the flexible enclosure so that electrical continuity of the network is maintained despite repeated flexing of the enclosure.

The invention is also a method of fabricating a biodegradable and recyclable disposable enclosure to shield an electronic apparatus when contained in the enclosure. The method comprises the steps of providing a biodegradable and recyclable enclosure in the form of a bag, and disposing on the surface a mesh-like topology of conductive lines. The mesh-like topology has open spaces between the lines to facilitate biodegradation of the bag.

In the step of disposing the mesh-like topology on the surface, the topology is disposed on the surface by printing the topology on the surface in a two-dimensional form so that the topology has a static surface resistivity of $10^6$ ohms per square inch or less.

The invention and its various embodiments may now be understood by referring to the following drawings wherein like elements are referenced by like numerals.

BRIEF DESCRIPTION OF THE DESCRIPTION OF THE DRAWINGS

Turn now to the following detailed description.

DETAILED DESCRIPTION OF PREFERRED EMBODIMENTS

The invention is a biodegradable and recyclable bag for enclosing electronic circuits or media to shield the same from electrostatic damage. The bag is made of kraft paper and has a grid printed completely over either the entire interior, exterior or both surfaces of the bag. The grid is printed of conductive, highly loaded, carbon ink and penetrates to a degree into the porous surface of the bag. The bag is constructed to have overlapping seams and each portion of the overlap of the seams has the conductive grid printed on it to provide an electrostatically leak-tight seam.

Figure 1:
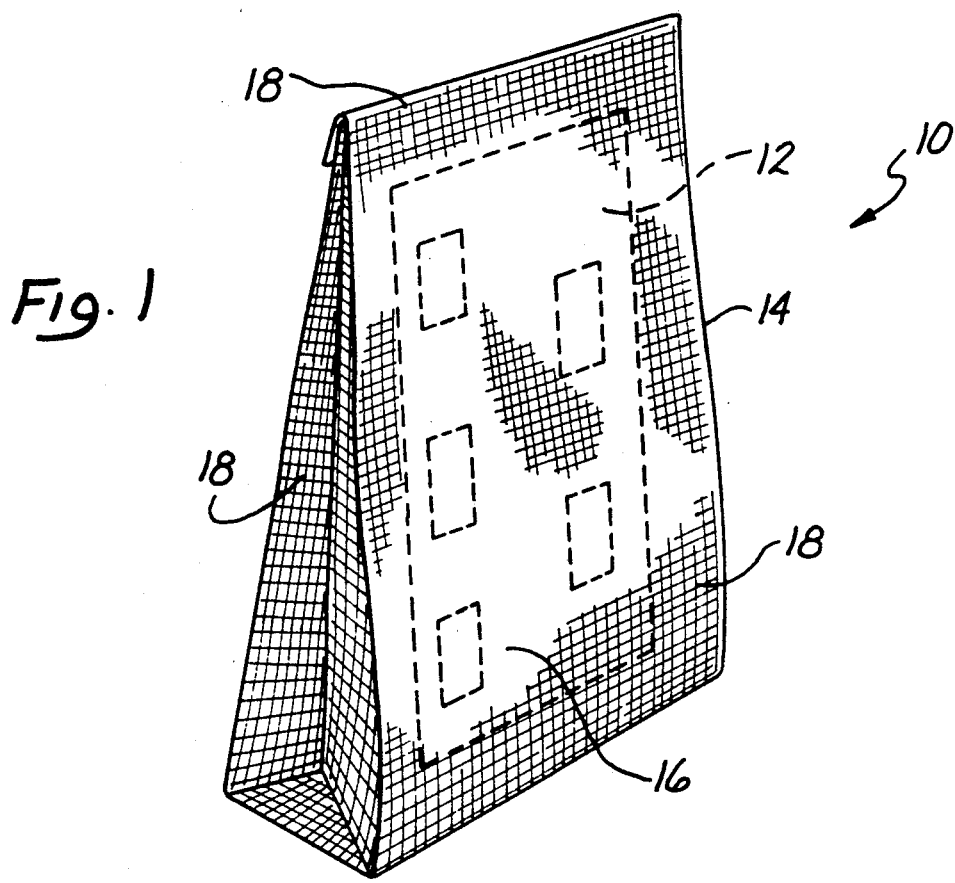
FIG. 1 is a perspective view of packaging incorporating the invention in which the electronic circuit has been enclosed.

FIG. 1 is perspective view of packaging, generally denoted by reference numeral 10, incorporating the invention in which a circuit 12 shown in dotted outline is enclosed. Any electrostatically sensitive product could beneficially be used with packaging 10 as well. In the illustrated embodiment, packaging 10 is a flexible bag 14 composed of a biodegradable and recyclable substance. In the illustrated embodiment bag 14 is comprised of as conventional kraft paper. In any case, the material of which bag 14 is made is porous or at least semi-porous to inks printed upon it and is composed entirely of biodegradable and recyclable matter.

The structure of packaging 10 can be devised in any manner known in the art, and in the illustrated embodiment, the conventional construction of a kraft paper bag is used. In the illustrated embodiment that construction which provides for a substantial overlap of print bearing material at the seams of packaging 10 is preferred to insure against electrostatic leakage through the seams. Packaging 10 provides a complete enclosure for circuit 12 so that no portion of circuit is directly exposed to any portion of the environment outside packaging 10. Packaging 10 is closable or sealable by conventional means including simply folding and tucking, taping, glueing,-stapling, or any other means devised in order to provide the closure of circuit 12 in packaging 10.

Exterior surface 16 of packaging 10 is provided with a conductive network 18 printed on the entire surface 16 including each of the sides, top and bottom of the bag and form an interconnected network or web. Network 18 in the illustrated embodiment is produced by printing a highly loaded carbonaceous ink in an open network on to the entire exterior surface 16 or packaging 10.

Figure 2:
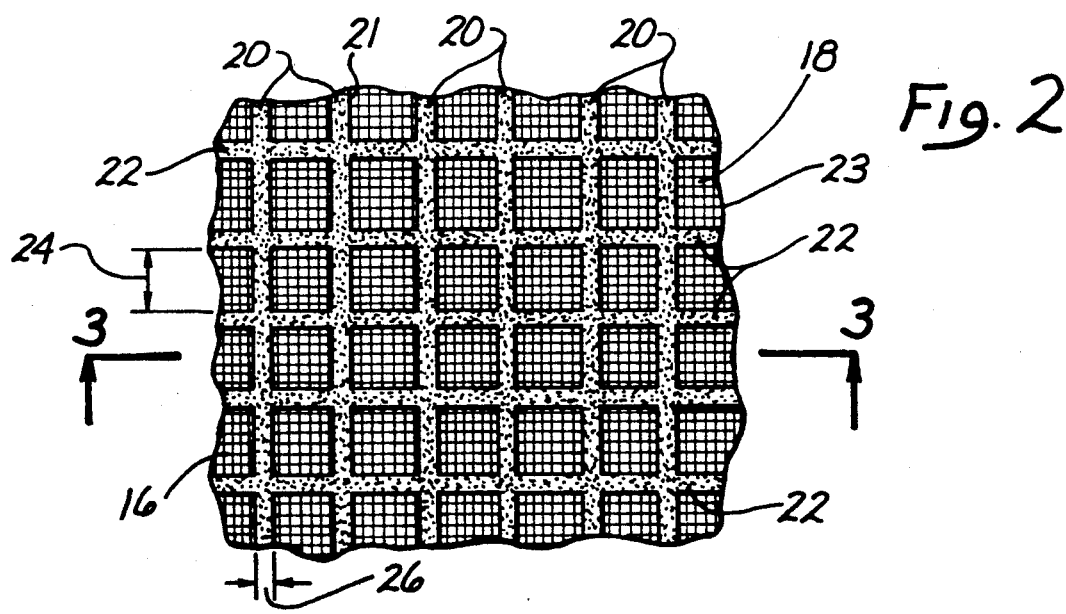
FIG. 2 is a highly magnified close up of the screen printed on the package of FIG. 1.

As shown in the enlargement of FIG. 2 in plan view, network 18 is comprised of a plurality of interconnected columns 20 and rows 22 forming a rectangular grid. Network 18 therefore resembles a closely interwoven screen which is conductive or at least partially conductive due to the high carbonaceous loading within the ink, which is biodegradable and recyclable itself, or which can re removed from the paper of bag 14 by conventional recycling methods.

Figure 3:
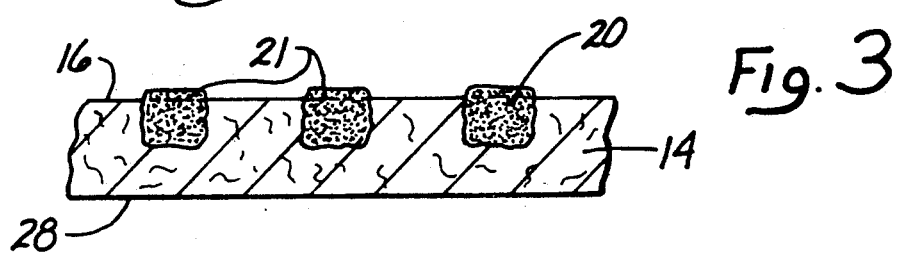
FIG. 3 is a side cross sectional view taken through lines 3—3 of FIG. 2 in highly magnified scale.

As shown in cross sectional enlarged view of FIG. 3 taken lines 3—3 FIG. 2 a printed ink, illustrated here as columns 20, penetrate into the porous or semiporous material of bag 14. Therefore, even as packaging 10 flexes, columns 20 and rows 22 forming network 18 flex with the material of bag 14 so that microscopic fissures are not created in columns 20 or 22 which remained conductive and interconnected with each other. Should such fissures or separations proliferate, the conductive shield provided by network 18 would be substantially compromised and the degree electrostatic shielding degraded.

In the illustrated embodiment the grid formed by columns 20 and rows 22 is substantially square with a separation 24 of approximately ⅛ inch. Columns 20 and rows 22 are approximately 3/32 inch wide. Within the major grid pattern defined by columns 20 and rows 22 is a finer grid defined by narrower printed grid lines forming columns 21 and rows 23. Columns 21 and 23 form a square grid with a separation between columns or rows of approximately 3/32 inch. The width of columns 21 and rows 23 are approximately 1/32 inch.

It must be understood that other grid patterns and other separations 24 could be equivalently used without the departing from the spirit and scope of the invention. For example, the grid pattern need not be square but may be rectangular and columns 20, 21 and rows 22, 23 need not be linear but may be curvilinear or serpentine or for that matter may not even form a grid. What is disclosed here is the application and use of a closely woven pattern of conductive lines of some sort, which pattern does not result in a coating that causes the bag to assume a treated, saturated or coated quality that substantially interferes with the biodegradability of the completed packaging. In the illustrated embodiment network 18 provides a surface resistivity of approximately $10^6$ ohms per square inch or less. In a test on a 2.5 inch by 24 inch, 40 lb. bag brown kraft bag incorporating the invention, electrostatic shielding at least as good as commercially acceptable prior art packaging as described above was measured.

Thickness 26 of columns 20, 21 and rows 22, 23 and separations 24 between perspective rows 22 or columns 20 or between columns 21 and rows 23 may be varied depending upon the strength of the electrostatic fields to which packaging 10 is to be subjected. The principles by which the screening may be varied to achieve electrostatic shielding are well understood from the technology relating to Faraday cages.

In the illustrated embodiment highly loaded carbonaceous ink is a conventional heavy black ink. The kraft paper of packaging 10 is 40 pound machine-finished kraft paper similar to that used with merchandise bags. Machine-finished kraft paper has a felt-like finish which enhances porosity and ink absorption into the paper. In order to provide greater durability and resistance to penetration from sharp elements included as part of circuit 12, the thickness of the kraft pater may be increased, for example, to 50 pound grocery type stock, or may be provided any type of internal biodegradable and recyclable laminations or coatings, such as a clay coating, which will render the interior surface packaging 10 more abrasive resistant or rip resistant. As long as the conductive ink forming network 18 is able to penetrate into the porous or semi-porous surface 16 of packaging 10, the treatment applied to opposing surface 28 may be arbitrarily varied in any manner consistent with the overall teachings of this invention.

Many modifications and alterations may be made by those having ordinary skill in the art without departing from the spirit and scope of the invention. For example, although network 18 has been shown as printed on the exterior of packaging 10, it is entirely within the scope of the invention that network 18 may be printed on the interior surface 28 instead. Further, although the illustrated embodiment has described a highly carbonaceous conductive or partially conductive ink, any other types of conductive ink may be employed. For example, metallic powder bearing ink maybe substituted if cost justified.

Therefore the illustrated embodiment has been set forth only for the purposes of example and should not be taken as limiting the invention as defined by the following claims, which include all the equivalent means and structures for performing substantially the same function to obtain substantially the same result even if accomplished in a substantially different way.

I claim:

1. A biodegradable and recyclable package for electrostatically shielding electronic apparatus from electrostatic fields in an ambient environment comprising:
    a porous biodegradable and recyclable flexible enclosure for completely enclosing said electronic apparatus, said enclosure having a surface between said electronic apparatus and said ambient environment, said enclosure being comprised of kraft paper; and
    a network of conductive lines disposed onto said enclosure on all of said surface, said network having a surface resistivity of $10^6$ ohms per square inch or less, said network comprising a plurality of closely spaced conductively lines printed on said surface to form a mesh-like topology, said lines being disposed on said surface by printing of highly carbon-loaded ink, said network being in the form of a grid of linear lines, said grid being comprised of a first grid portion having columns and rows with a first degree of separation between adjacent columns and adjacent rows, and a second grid portion having columns and rows with a second degree of separation between adjacent columns and adjacent rows, said second degree of separation having a magnitude less than said first degree of separation, said first grid portion and second grid portion each being disposed over all of said surface, said network penetrating into at least a portion of said porous enclosure beneath said surface, said network being flexible at least as much as said flexible enclosure so that electrical continuity of said network is maintained despite repeated flexing of said enclosure,
    wherein said enclosure is fabricated in the form of a bag, said bag having at least one seam, said seam formed of two overlapping portions of said bag affixed together, said overlapping portions each having said network disposed thereon,
    whereby said electronic apparatus is effectively shielded from said electrostatic fields by said package and whereby said package is disposable, biodegradable and recyclable.

2. A static-dissipative, electrostatically shielding, flexible, biodegradable container for shielding an electronic apparatus in an ambient environment comprising:
    an enclosure fabricated from flexible sheet material, said enclosure providing a surface between said electronic apparatus and said ambient environment; and
    a network of conductive lines disposed onto said surface of said enclosure on all of said surface and penetrating into said flexible sheet material to retain electrical continuity of said network despite repeated flexing of said sheet material,
    whereby said electronic apparatus is reliably shielded from electrostatic fields and whereby said container is disposable, biodegradable and recyclable.

3. The container of claim 2 wherein said container is comprised of kraft paper and wherein said network is comprised of highly carbon-loaded ink printed onto said kraft paper and disposed therein.

4. The container of claim 3 wherein said network is in the form of a grid of lines comprised of a first grid portion having a first line thickness and a first row and column pitch and a second grid portion having a second more narrow line thickness and a second smaller row and column pitch, said first and second grid portions being interposed to lie on top of each other.

5. The container of claim 3 wherein said kraft paper is porous so that said network penetrates into at least a portion of said container beneath said surface to maintain electrical continuity as said container flexes.

6. The container of claim 3 wherein said container includes seams and wherein said network is electrically coupled across said seams to maintain electrical continuity on all of said surface of said container.

7. A method of fabricating a biodegradable, recyclable disposable, flexible, closeable container to shield an electronic apparatus when enclosed in said container comprising the steps of:
    providing a flexible kraft paper sheet adapted to be formed into said closeable container; and
    disposing into the surface of said kraft paper sheet highly carbon loaded ink to form a connected network of lines when said sheet is formed into said container, said disposition being deep enough to allow said network to retain electrical continuity even when said sheet repeatedly flexes.

8. The method of claim 7 where in said step of disposing said network into said sheet, said network is disposed into said sheet with a carbonaceous content sufficient to render said sheet with an average static resistivity of at least $10^6$ ohms per square inch or less.

* * * * *